(12) United States Patent
Lai et al.

(10) Patent No.: US 11,680,958 B2
(45) Date of Patent: *Jun. 20, 2023

(54) PARTICLE IMAGE VELOCIMETRY OF EXTREME ULTRAVIOLET LITHOGRAPHY SYSTEMS

(71) Applicant: TAIWAN SEMICONDUCTOR MANUFACTURING COMPANY, LTD., Hsinchu (TW)

(72) Inventors: En Hao Lai, Hsinchu (TW); Chi Yang, Tainan (TW); Shang-Chieh Chien, New Taipei (TW); Li-Jui Chen, Hsinchu (TW); Po-Chung Cheng, Longxing Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 2 days.

This patent is subject to a terminal disclaimer.

(21) Appl. No.: 17/340,762

(22) Filed: Jun. 7, 2021

(65) Prior Publication Data

US 2021/0294220 A1    Sep. 23, 2021

Related U.S. Application Data

(63) Continuation of application No. 16/579,660, filed on Sep. 23, 2019, now Pat. No. 11,029,324.

(Continued)

(51) Int. Cl.
*G01P 5/20* (2006.01)
*H05G 2/00* (2006.01)
(Continued)

(52) U.S. Cl.
CPC ............ *G01P 5/20* (2013.01); *G02B 27/0006* (2013.01); *G03F 1/42* (2013.01); *G03F 7/20* (2013.01); *G03F 7/70025* (2013.01); *G03F 7/70033* (2013.01); *H05G 2/005* (2013.01); *H05G 2/008* (2013.01)

(58) Field of Classification Search
CPC .. G01P 5/20; G01P 5/26; H05G 2/005; H05G 2/008; G02B 27/0006; G03F 7/70033; G03F 7/2004; G03F 7/7085
See application file for complete search history.

(56) References Cited

U.S. PATENT DOCUMENTS 7,915,600 B2    3/2011  Ueno et al.
3,796,666 A1    8/2014  Huang et al.
(Continued)

OTHER PUBLICATIONS

Non-Final Office Action issued in U.S. Appl. No. 16/579,660, dated Nov. 2, 2020.

(Continued)

*Primary Examiner* — David A Vanore
(74) *Attorney, Agent, or Firm* — McDermott Will & Emery LLP

(57) ABSTRACT

A method includes irradiating a target droplet in an extreme ultraviolet light source of an extreme ultraviolet lithography tool with light from a droplet illumination module. Light reflected and/or scattered by the target droplet is detected. Particle image velocimetry is performed to monitor one or more flow parameters inside the extreme ultraviolet light source.

6 Claims, 11 Drawing Sheets

Related U.S. Application Data

(60) Provisional application No. 62/738,394, filed on Sep. 28, 2018.

(51) Int. Cl.
*G02B 27/00* (2006.01)
*G03F 1/42* (2012.01)
*G03F 7/20* (2006.01)
*G03F 7/00* (2006.01)

(56) References Cited

U.S. PATENT DOCUMENTS

| | | |
|---|---|---|
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 11,029,324 B2 * | 6/2021 | Lai ............... G03F 7/70025 |
| 2008/0035865 A1 | 2/2008 | Komori et al. |
| 2010/0258749 A1 | 10/2010 | Partlo et al. |
| 2011/0013166 A1 | 1/2011 | Loopstra et al. |
| 2019/0094718 A1 | 3/2019 | Yang et al. |
| 2019/0137882 A1 | 5/2019 | Lai et al. |
| 2019/0150265 A1 | 5/2019 | Hsieh et al. |
| 2019/0155157 A1 | 5/2019 | Chen et al. |
| 2019/0166680 A1 | 5/2019 | Hsu et al. |
| 2020/0033732 A1 | 1/2020 | Hsieh et al. |
| 2020/0045800 A1 | 2/2020 | Hsu et al. |

OTHER PUBLICATIONS

Notice of Allowance issued in U.S. Appl. No. 16/579,660, dated Feb. 3, 2021.

* cited by examiner

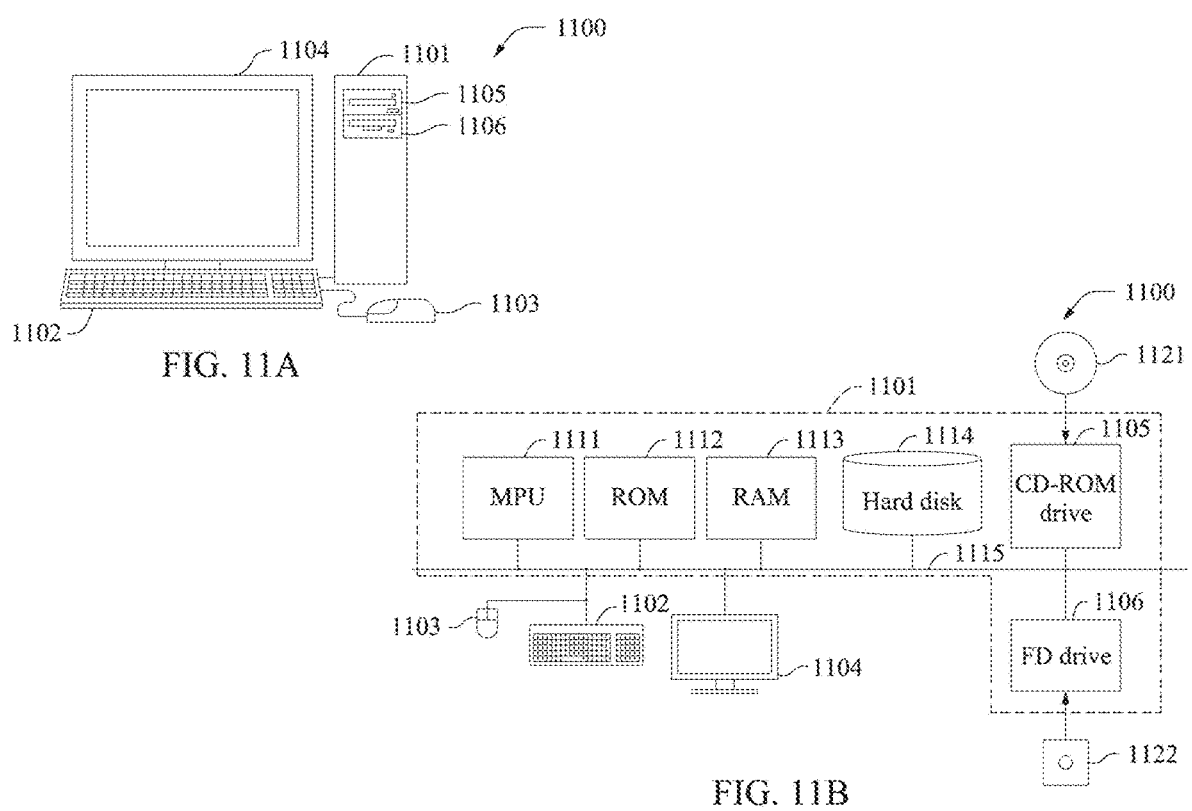

PARTICLE IMAGE VELOCIMETRY OF EXTREME ULTRAVIOLET LITHOGRAPHY SYSTEMS

PRIORITY CLAIM AND CROSS-REFERENCE

This application is a Continuation of U.S. patent application Ser. No. 16/579,660 filed on Sep. 23, 2019, now U.S. Pat. No. 11,029,324, which claims priority to U.S. Provisional Application 62/738,394 filed on Sep. 28, 2018, the entire disclosures of the two applications are incorporated herein by reference.

BACKGROUND

The wavelength of radiation used for lithography in semiconductor manufacturing has decreased from ultraviolet to deep ultraviolet (DUV) and, more recently to extreme ultraviolet (EUV). Further decreases in component size require further improvements in resolution of lithography, which are achievable using extreme ultraviolet lithography (EUVL). EUVL employs radiation having a wavelength of about 1-100 nm. One method for producing EUV radiation is laser-produced plasma (LPP). In an LPP-based EUV source, a high-power laser beam is focused on small droplet targets of metal, such as tin, to form a highly ionized plasma that emits EUV radiation with a peak maximum emission at 13.5 nm.

The collector mirror reflectance is an important factor in an EUV radiation source for an EUVL system. The reflective quality of the collector mirror directly affects the power and wavelength of the reflected EUV light rays. A low quality collector mirror having uneven thickness, uneven surface roughness, and non-uniform reflectance of layers in the mirror, reduces the total amount of reflected EUV light rays and the reflected EUV light rays have a lower power and different or a mixture of wavelengths, compared with the EUV light rays directly generated from the plasma. The collector mirror is subject to contamination. For example, plasma formation during the EUV light ray generation also generates debris, which may deposit on the reflective surface of the collector mirror, thereby contaminating the reflective surface of the collector mirror and lowering the quality of the reflected EUV light rays. Thus, EUV collector mirrors have a limited service life, as they tend to be fouled by accumulating tin debris, which degrades the reflectance of the collector mirror when in use. Thus, the EUV collector mirror needs to be replaced due to the debris contamination. Each time a fouled/contaminated collector mirror is replaced, several days of production are lost for the EUVL system, because the optics between the collector mirror, source, and scanner have to be re-aligned. A monitoring system to determine when the EUV collector mirror needs to be replaced is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 11A and 11B illustrate an apparatus for velocimetry of droplets of debris of an EUV lithography system and monitoring collector mirror contamination, according to some embodiments of the present disclosure.

DETAILED DESCRIPTION

Figure 1:
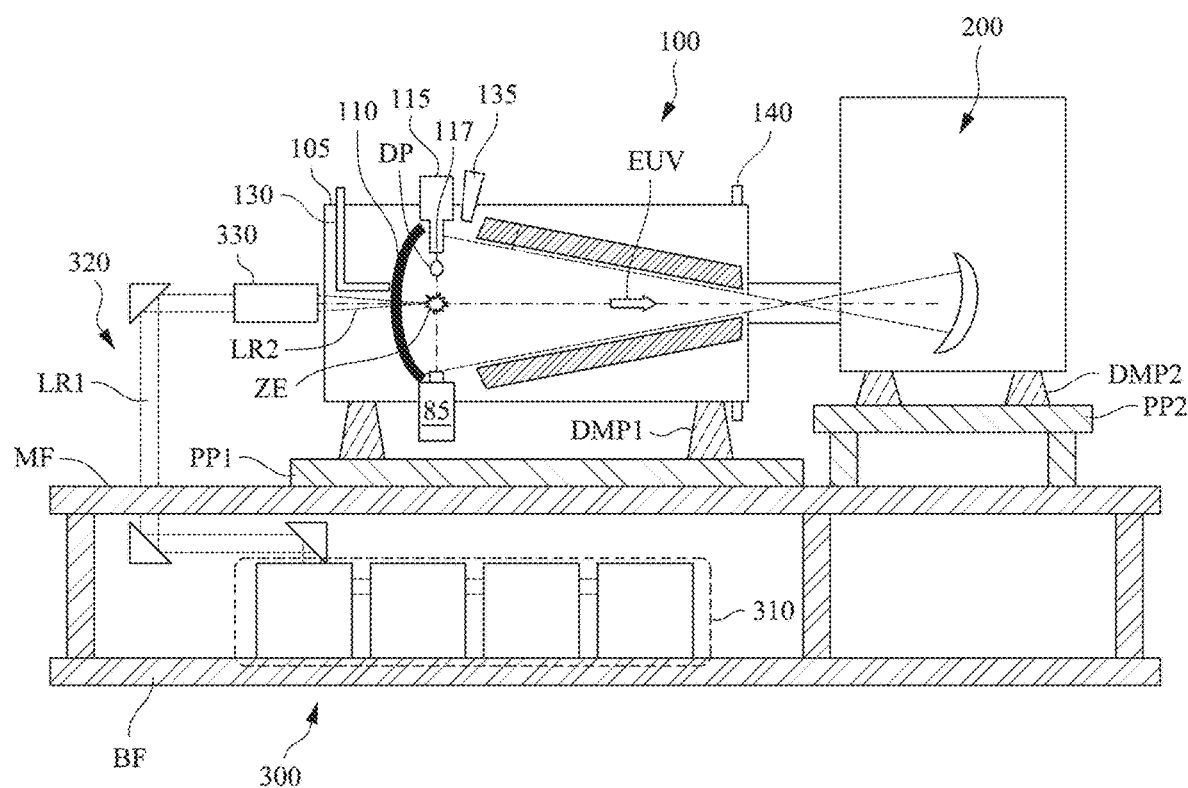
FIG. 1 is a schematic view of an EUV lithography system with a laser produced plasma (LPP) EUV radiation source in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to extreme ultraviolet lithography (EUVL) systems and methods. More particularly, it is related to apparatuses and methods for monitoring the contamination on a collector mirror in a laser produced plasma (LPP) EUV radiation source. The collector mirror, also referred to as an LPP collector mirror or an EUV collector mirror, is an important component of the LPP EUV radiation source. It collects and reflects EUV radiation and contributes to overall EUV conversion efficiency. However, it is subjected to damage and degradation due to the impact of particles, ions, radiation, and debris deposition. In particular, tin (Sn) debris is one of the contamination sources of the EUV collector mirror. An EUV collector mirror life time, the duration of the reflectivity decays to half of itself, is one of the most important factors for an EUV scanner. The major reason for decay of the collector mirror is the residual metal contamination (tin debris) on the collector mirror surface caused by the EUV light generation procedure.

The excitation laser heats metal (e.g., tin) target droplets in the LPP chamber to ionize the droplets to a plasma which emits the EUV radiation. During laser-metal interaction, a tin droplet may be missed by or not interact sufficiently with the laser beam, forming debris. Also, some tin leftover from the plasma formation process can become debris. The debris can accumulate on the surface of the EUV collector mirror, deteriorating the reflective quality of the EUV collector mirror. Monitoring the flow of the debris in the EUV radiation source is important to determine how the debris move and where the debris are deposited. Parameters that are monitored and controlled in the EUV radiation source, in some embodiments, include the flow pattern of the gases, metal droplets (e.g., tin droplets), and debris in the EUV radiation source; debris propagation direction and speed; and spatial evolution of the plasma shockwave. The flow pattern of the metal droplets and debris may be determined by observing the metal droplets and debris particles in successive images taken from inside of the EUV radiation source and determining the velocity of the metal droplets and debris particles. In some embodiments, the flow pattern of the gases are determined based on the flow pattern of metal droplets and/or debris particles. Monitoring the flow pattern of the metal droplets and debris in the EUV radiation source of the EUVL system, may determine a map of an amount of debris that are deposited on the collector mirror. Based on the map of the amount of debris on the collector mirror, it may be determined when EUV collector mirror half life time is reached, when to clean the collector mirror, or when to replace the collector mirror.

A droplet illumination modules (DIM) is used to illuminate the inside of the EUV radiation source and a droplet detection module (DDM) is used to measure the parameters corresponding with the particles of the debris. The DIM directs non-ionizing light, e.g., a laser light, to the target droplet and the reflected and/or scattered light is detected by the DDM. The light from the DIM is "non-ionizing" and the light from the DIM is used to illuminate the metal droplets and debris inside the EUVL system. The embodiments of the present disclosure are directed to controlling droplet illumination and detection for accurately measuring the parameters related to the metal droplets and debris inside the EUVL system and particularly near the collector mirror.

FIG. 1 is a schematic view of an EUV lithography system with a LPP-based EUV radiation source, in accordance with some embodiments of the present disclosure. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optical components, such as convex/concave/flat mirrors, a mask holding mechanism including a mask stage, and wafer holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. The exposure device 200 is described in more details with respect to FIG. 2.

In the present disclosure, the terms mask, photomask, and reticle are used interchangeably. In some embodiments, the mask is a reflective mask. In some embodiments, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure device 200 includes a projection optics module for imaging the pattern of the mask on to a semiconductor substrate with a resist coated thereon secured on a substrate stage of the exposure device 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes. The lithography system may further include other modules or be integrated with (or be coupled with) other modules.

As shown in FIG. 1, the EUV radiation source 100 includes a target droplet generator 115 and a LPP collector mirror 110, enclosed by a chamber 105. A droplet DP that does not interact goes to droplet catcher 85. The target droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm, in an embodiment. The laser light beam LR1 generated by the laser source 300 is guided by the laser guide optics 320 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser.

In some embodiments, the excitation laser beam LR2 includes a pre-heat laser pulse and a main laser pulse. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser (main pulse), generating increased emission of EUV light compared to when the pre-heat laser pulse is not used.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation, which is collected by the collector mirror 110. The collector mirror 110, an EUV collector mirror, further reflects and focuses the EUV radiation for the lithography exposing processes performed through the exposure device 200.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{dp}=d/(t_{rad}-t_o) \qquad \text{Equation (1).}$$

Because the droplet generator is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, that the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized.

In an EUV radiation source 100, the plasma caused by the laser application creates debris, such as ions, gases and atoms of the droplet, as well as the desired EUV radiation. It is necessary to prevent the accumulation of material, e.g., debris, on the collector mirror 110 and also to prevent debris exiting the chamber 105 and entering the exposure device 200.

As shown in FIG. 1, a buffer gas is supplied from a first buffer gas supply 130 through the aperture in collector mirror 110 by which the pulse laser is delivered to the tin droplets. In some embodiments, the buffer gas is $H_2$, He, Ar, N or another inert gas. In certain embodiments, $H_2$ is used as H radicals that are generated by ionization of the buffer gas and can be used for cleaning purposes. The buffer gas can also be provided through one or more second buffer gas supplies 135 toward the collector mirror 110 and/or around the edges of the collector mirror 110. Further, the chamber 105 includes one or more gas outlets 140 so that the buffer gas is exhausted outside the chamber 105. Hydrogen gas has low absorption to the EUV radiation. Hydrogen gas reaching to the coating surface of the collector mirror 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the gas outlet 140. However, it is difficult to exhaust all gaseous $SnH_4$ from the chamber and to prevent the $SnH_4$ from entering the exposure device 200. Therefore, monitoring and/or control of the debris in the EUV radiation source 100 is beneficial to the performance of the EUVL system.

Figure 2:
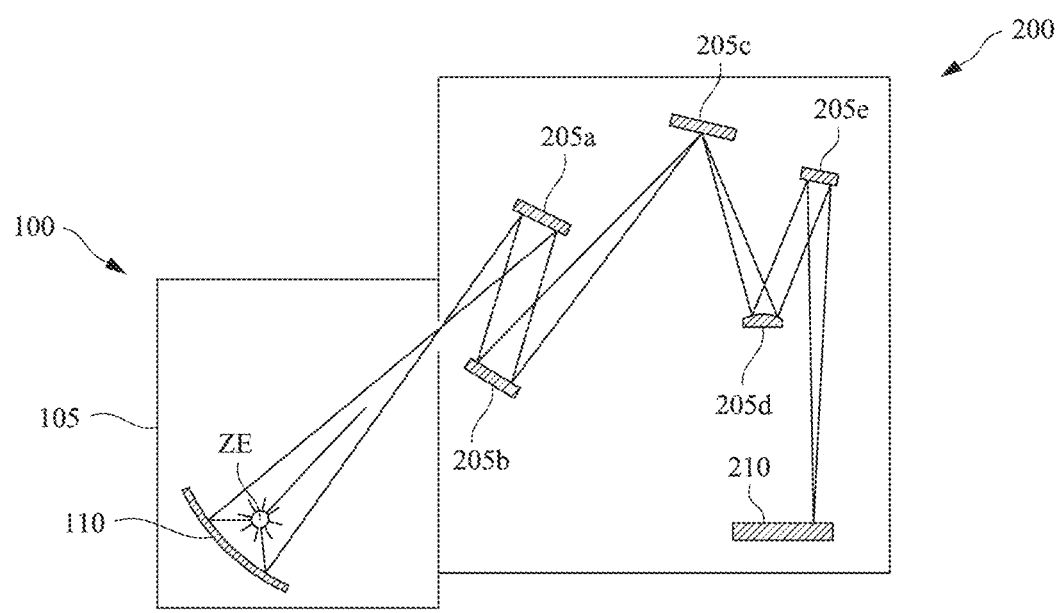
FIG. 2 is a schematic view of an EUV lithography exposure tool in accordance with some embodiments of the present disclosure.

FIG. 2 is a schematic view of an EUVL exposure tool in accordance with some embodiments of the present disclosure. The EUVL exposure tool of FIG. 2 includes the exposure device 200 that shows the exposure of photoresist coated substrate, a target substrate 210, with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the target substrate 210. A mechanical assembly (not shown) may be provided for generating a controlled relative movement between the target substrate 210 and patterning optic 205c. As further shown, the EUVL exposure tool of FIG. 2, further includes the EUV radiation source 100 including a plasma plume 23 at the zone of excitation ZE emitting EUV light in the chamber 105 that is collected and reflected by a collector mirror 110 into the exposure device 200 to irradiate the target substrate 210.

Figure 3:
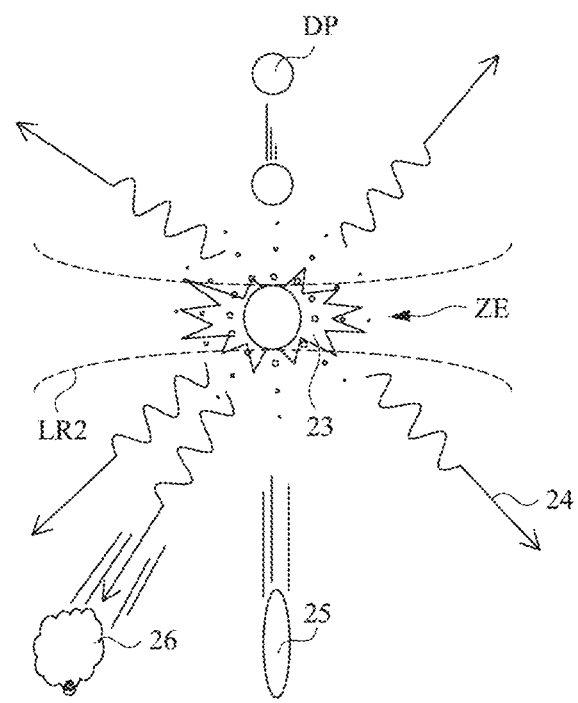
FIG. 3 shows a schematic view of plasma formation process through laser-metal interaction between a laser beam and a metal droplet in accordance with some embodiments of the present disclosure.

FIG. 3 shows a schematic view of plasma formation process through laser-metal interaction between a laser beam and a metal droplet in accordance with some embodiments of the present disclosure. In FIG. 3, the ejected metal droplet, e.g., the ejected tin droplet DP, reaches the zone of excitation ZE where it interacts with the laser beam LR2 to form a plasma. The zone of excitation ZE is at a focus of the high-power and high-pulse-repetition-rate pulsed laser beam LR2. The laser beam LR2 interacts with the ejected tin droplet DP at the ignition site in a space of the chamber of the EUVL system to form the plasma plume 23 which emits EUV light rays 24 in all directions. During this laser-metal interaction, a tin droplet DP could be missed by or not interact sufficiently with the laser beam LR2, thereby passing to a position below the zone of excitation ZE in FIG. 3, forming debris droplet 25. Also, some tin leftover from the plasma formation process can become debris 26. The debris droplet 25 and debris 26 can accumulate on the surface of the EUV collector mirror, e.g., collector mirror 110 of FIG. 1, deteriorating the reflective quality of the EUV collector mirror 110. The debris 26 and debris droplet 25 contaminate the collector mirrors 110 such that the collector mirror 110 may need to cleaned and/or replaced, thereby increasing the maintenance cost, and more importantly, reducing the availability of the EUVL system. Replacing or cleaning the collector mirror 110 is time consuming, for example, replacement of the EUV collector mirror 110 may require up to 4 days. Thus, cleaning or replacing the collector mirror 110 before it is needed increases the maintenance cost and not cleaning or replacing the collector mirror 110 when the cleaning or replacement is needed deteriorates the EUV radiation. Therefore, there is a demand for an improved method of monitoring the debris on collector mirror 110 to determine when cleaning and/or replacement of the collector mirror 110 because of the contamination by the debris droplet 25 and the debris 26 is needed. The plasma formation process is described in more details with respect to FIG. 4.

Figure 4:
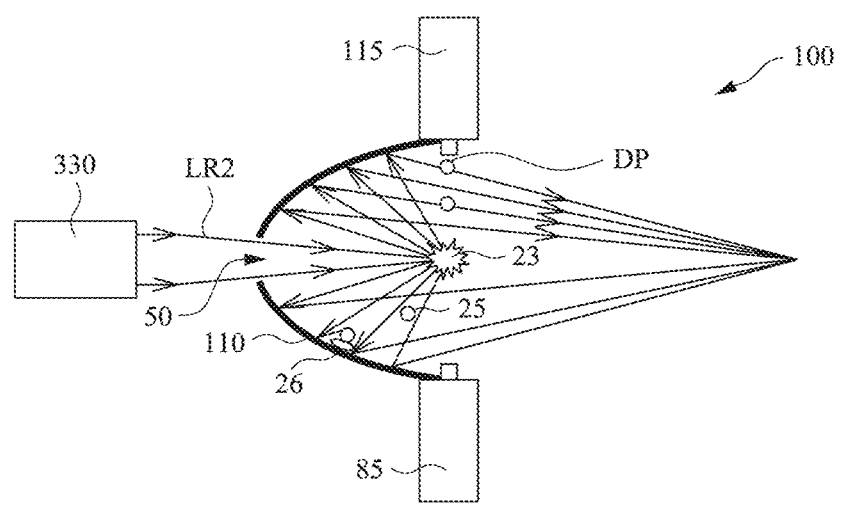
FIG. 4 shows a cross-sectional view of the EUV radiation source in an operation situation in accordance with some embodiments of the present disclosure.

FIG. 4 shows a cross-sectional view of the EUV radiation source in an operation situation in accordance with some embodiments of the present disclosure. The EUV radiation source 100 includes the focusing apparatus 330, the collector mirror 110, the target droplet generator 115, an aperture 50 for entering the laser beam LR2, and a drain such as a droplet catcher 85, e.g., a tine catcher, for the unreacted tin droplets, the debris droplet 25. The collector mirror 110 is made of a multi-layered mirror including Mo/Si, La/B, $La/B_4C$, $Ru/B_4C$, $Mo/B_4C$, $Al_2O_3/B_4C$, W/C, Cr/C, and Cr/Sc with a capping layer including $SiO_2$, Ru, $TiO_2$, and $ZrO_2$, in some embodiments. The diameter of the collector mirror 110 can be about 330 mm to about 750 mm depending on the chamber size of the EUV radiation source 100. The cross-sectional shape of the collector mirror 110 can be elliptical or parabolic, in some embodiments.

Since the plasma plume 23 includes active and highly charged particles or ions such as tin (Sn) ions, and a spatial positional error/tolerance may exist between the tin droplet DP and the focus position of the laser beam ZE, debris is formed and can be pushed by the high power radiation toward the lower-half region of the reflective surface of the collector mirror 110, causing contamination of the collector mirror 110. Also, due to the synchronization control the laser beam pulse frequency and the speed of the ejected tin droplet DP, some droplets are laser-missed and become debris droplets 25 and some droplet under react with the laser beam. The under-reacted portion of a tin droplet DP may form debris 26 which deposits on the lower-half portion of the reflective surface of the collector mirror 110. The deposited debris 26 or debris droplets 25 deteriorate the reflective property of the collector mirror 110, thereby lowering the power of EUV radiation source 100 for EUV photolithography of the target substrate 210 of FIG. 2, and lowering the quality (such as critical dimension CD and line edge roughness ((LER) of patterns formed on the photo-sensitive coating (not shown) on the target semiconductor substrate 210. Therefore, there is a demand for monitoring the debris 26 and debris droplets 25 deposition onto the reflective surface of the collector mirror 110.

Figure 5B:
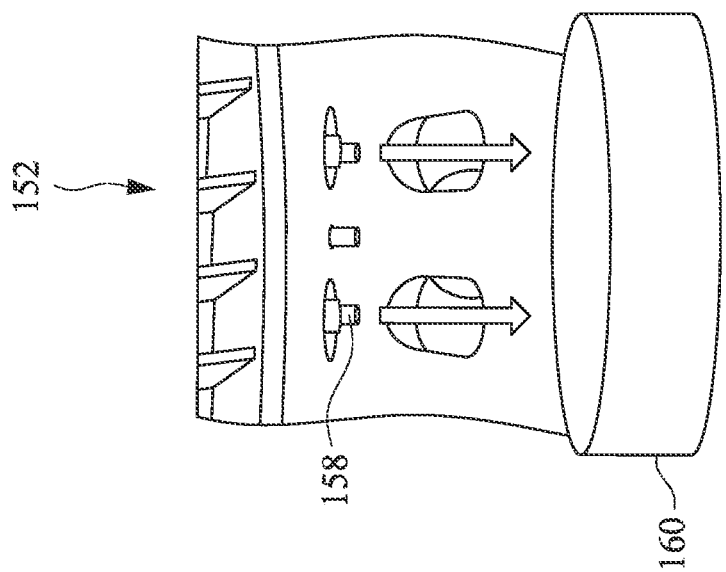
FIG. 5B shows a detailed view of drip holes and a debris receptacle in accordance with some embodiments of the present disclosure.
Figure 5A:
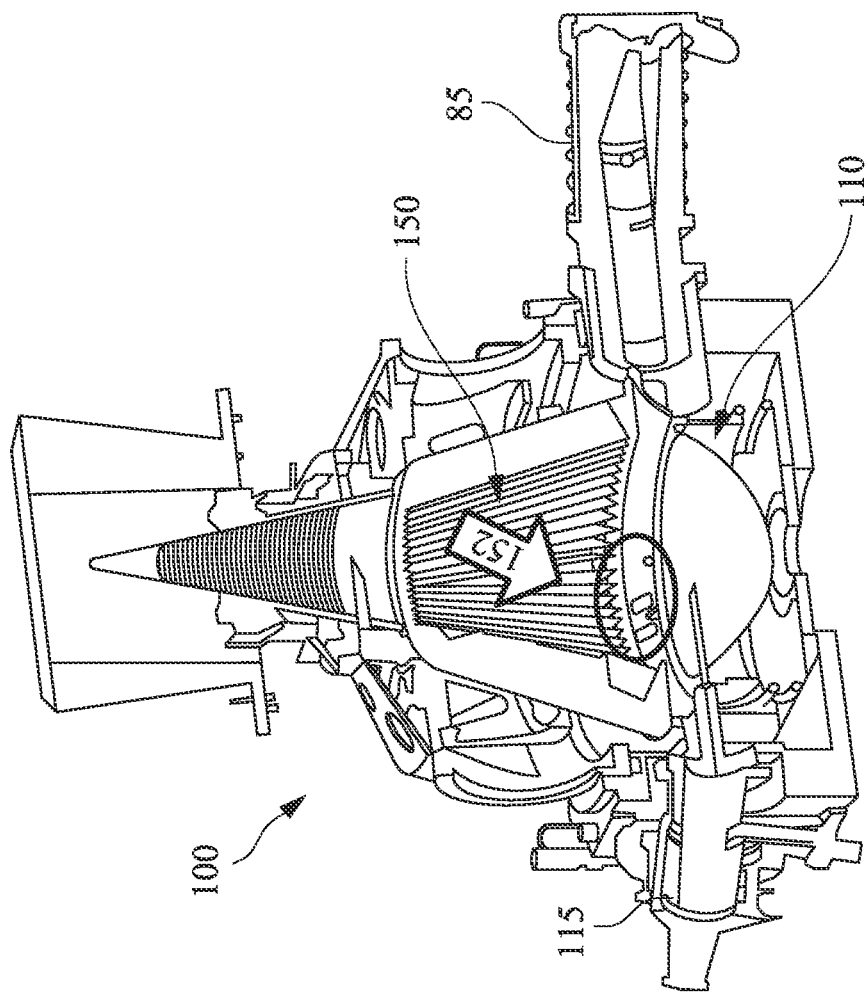
FIG. 5A shows a schematic view of a collector mirror and relating portions of an EUV radiation source in accordance with some embodiments of the present disclosure.

FIG. 5A shows a schematic view of a collector mirror and relating portions of an EUV radiation source in accordance with some embodiments of the present disclosure. FIG. 5A shows a schematic view of the EUV radiation source 100, including a debris collection mechanism 150, the collector mirror 110, the target droplet generator 115, and the droplet catcher 85. The circled area 152 in FIG. 5A is shown close up in FIG. 5B.

FIG. 5B shows a detailed view of drip holes and a debris receptacle in accordance with some embodiments of the present disclosure. As shown by the arrows in FIG. 5B, molten debris, such as excess tin, passes through drip holes (or fluid passages) 158 and into a debris receptacle 160 (e.g., a tin bucket). The debris receptacle 160 is located outside of the optical path of the EUV radiation source 100, in some embodiments.

In some embodiments, the debris receptacle 160 is located behind the collector mirror 110 of FIG. 5A. In some embodiments, the debris receptacle 160 is made of material suitable for collecting molten debris, such as molten tin. In some embodiments, the debris receptacle 160 is made of a steel. The debris receptacle 160 can be cleaned, emptied, or replaced during routine maintenance of the EUV radiation source, such as when swapping out the collector mirror 110. As shown in FIG. 5B, in some embodiments, there is a plurality of drip holes (or fluid passages) 158 located adjacent the bottom of the debris collection mechanism 150.

Figure 6B:
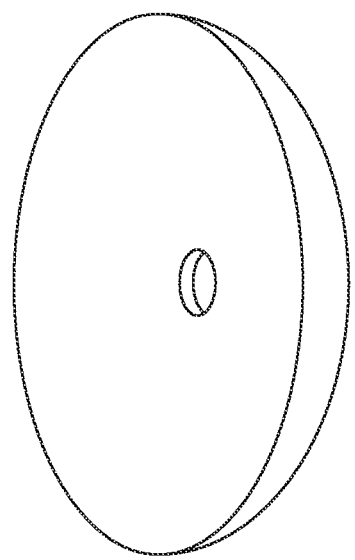
FIG. 6B shows an EUV collector mirror after cleaning the surface thereof in accordance with some embodiments of the present disclosure.
Figure 6A:
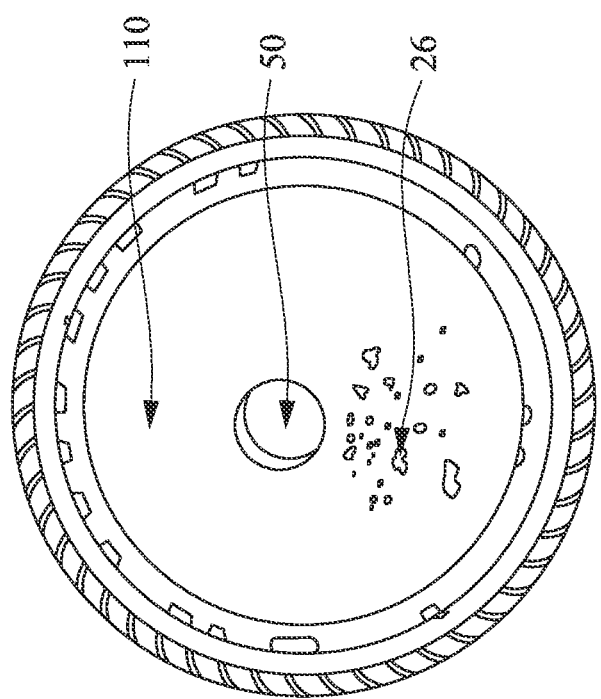
FIG. 6A shows contamination of the EUV collector mirror in the chamber of the EUVL system in accordance with some embodiments of the present disclosure.

FIG. 6A shows contamination of the EUV collector mirror in the chamber of the EUVL system in accordance with some embodiments of the present disclosure. FIG. 6A shows collector mirror contamination of the EUV collector mirror 110 having the aperture 50. After prolonged use, the area of the reflective surface of the collector mirror 110 that is covered by the deposited debris 26 increases and the functioning of the collector mirror 110 decreases. Without cleaning the contaminated collector mirror 110 from the debris 26 or replacing the collector mirror 110, the quality of the pattern formed on the target substrate 210 of FIG. 2 using the contaminated collector mirror 110 would be degraded, affecting the productivity of high quality chips. FIG. 6B shows an EUV collector mirror after cleaning the surface thereof in accordance with some embodiments of the present disclosure.

Figure 7B:
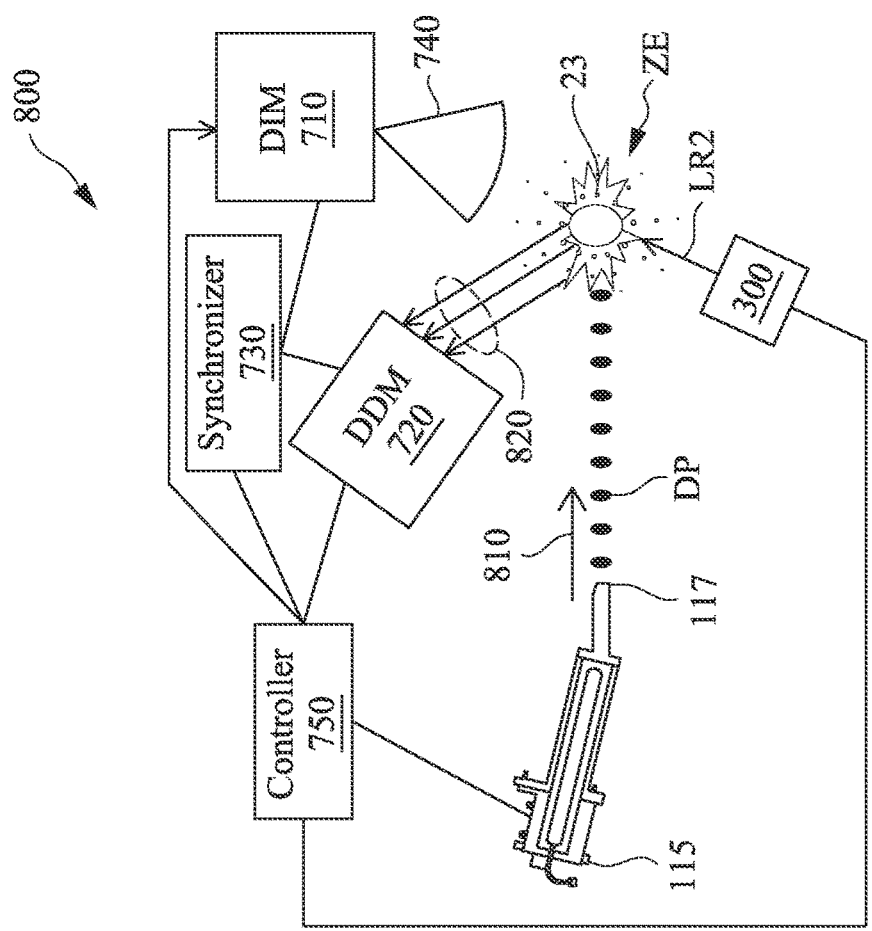
FIGS. 7A and 7B show devices for illuminating and imaging tin droplets and tin debris in an EUV radiation source in accordance with some embodiments of the present disclosure.
Figure 7A:
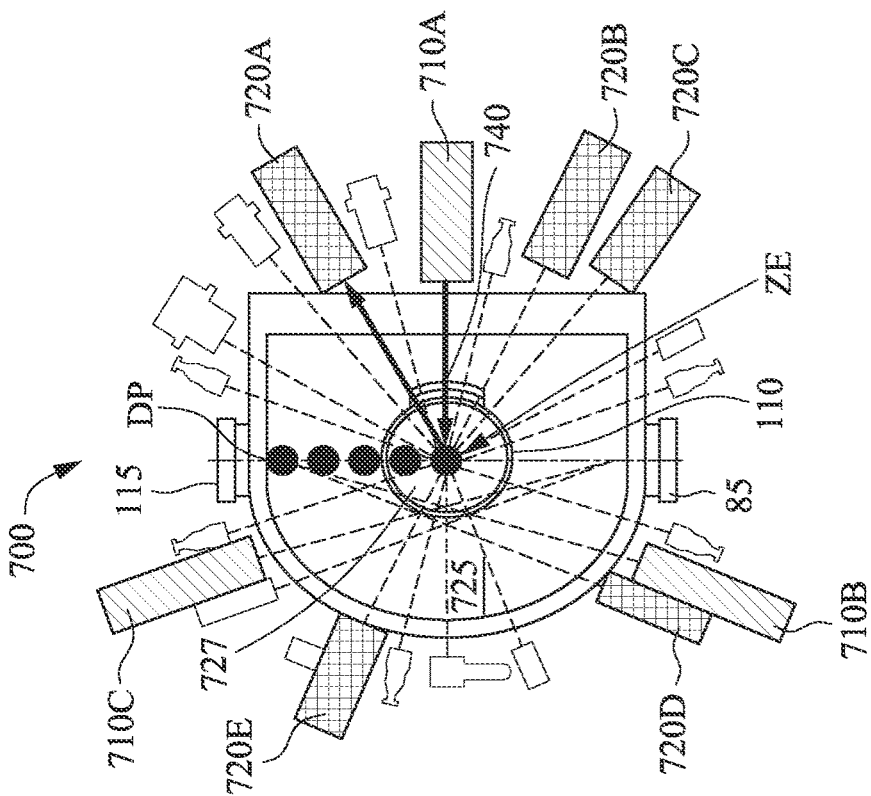

FIGS. 7A and 7B show devices for illuminating and imaging tin droplets and tin debris in an EUV radiation source in accordance with some embodiments of the present disclosure. FIG. 7A is a plan view 700 of a cut of the EUV radiation source 100 of FIG. 1. FIG. 7A shows a DIM 710A, a DDM 720A, the collector mirror 110, and the tin droplets DP moving from target droplet generator 115 to the zone of excitation ZE. The DIM 710A provides a light beam 740 to illuminate the droplets DP at the zone of excitation ZE. In some embodiments, the DIM 710A includes one or more light sources, such as a laser source to illuminate the zone of excitation ZE. In some embodiments, the DDM 720A includes one or more image sensors, such as a camera, e.g., a digital camera. In some embodiments, through illuminating the zone of excitation ZE and an area around the ZE by the DIM 710A, the camera of the DDM 720A takes at least two images of the area around the zone of excitation ZE after the droplet DP is hit by laser beam LR2 (not shown). The images are taken, e.g., captured, successively with a slight time difference, e.g., from about 200 nano-seconds (ns) to about 200 micro-seconds (ms) between them and thus the images show how the droplets DP moves from one image to the next image.

In some embodiments, a plurality of DIMS is installed around the EUV radiation source 100. As shown in FIG. 7A, in addition to the DIM 710A, DIMS 710B and 710C are also installed around the EUV radiation source 100 such that the light sources of DIMs 710B and 710C illuminate different locations and take different views of the zone of excitation ZE. Also, as shown in FIG. 7A, in addition to the DDM 720A, DDMs 720B, 720C, 720D, and 720E are also installed around the EUV radiation source 100 such that the cameras of the DDMs 720B, 720C, 720D, and 720E take images of multiple viewpoints inside the EUV radiation source 100. In some embodiments, the light source of the DIM 710A provides illumination in the shape of a light curtain beam 740 having substantially the same intensity across its profile that illuminates an area, e.g., illuminates a plane. In some embodiments, the illuminated plane is a first plane that includes the droplet generator 115, the zone of excitation ZE, and the droplet catcher 85. In some embodiments, the first plane includes a cross-sectional area 727 between the rims of collector mirror 110. In some other embodiments, the first plane in addition to the cross-sectional area 727, includes at least a portion of a cross-sectional area 725 outside the cross-sectional area 727. The camera of the DDM 720A takes at least two images of the illuminated plane. Therefore, the two or images taken by the camera of the DDM 720A show the location of the droplets DP that are being released from the droplet generator 115 before reaching the zone of excitation ZE. In some embodiments, the two or images taken by the camera of the DDM 720A show the plasma plume 23 of FIG. 3, and the debris 26 and the debris droplets 25 of FIG. 3 that are missed by the laser beam LR2 and drops towards the droplet catcher 85. As noted, the images are taken successively, with a slight time difference between them, and thus the images show how the droplets DP, the debris droplets 25, and the debris 26 move from one image to the next image in the illuminated plane. In some embodiments, a velocity of the droplets DP, the debris droplets 25, and the debris 26 in the illuminated plane is determined based on the successive images. In some embodiments, the debris 26 of FIG. 3, does not stay in the illuminated plane and thus a velocity of the debris 26 is not determined from the successive images of the illuminated plane. In some embodiments, the light curtain beam produced by the DIM 710A or the light curtain beams produced by the other DIMs 710B or 710C has a width in the range of about 2000 μm to about 3000 μm.

In some embodiments, the light sources of the DIMS 710A, 710B, and/or 710C illuminate multiple parallel planes perpendicular to the first plane. The parallel planes extend in the volume between the first plane and the collector mirror 110, e.g., an inside surface of the collector mirror 110. In some embodiments, a location of the light sources of the DIMs 710A, 710B, and 710C are controlled by stepper motors such that each light source moves and provides multiple parallel light curtains, e.g., illuminates multiple parallel planes. In some embodiments, the first plane is a vertical plane and the one or more DIMS provide multiple horizontal and vertical illuminated planes in the volume between the first plane and the collector mirror 110. The cameras of the DDMs 720A, 720B, 720C, 720D, and 720E, take two or more images, with the slight time difference between consecutive images. Also, the DDMs 720A, 720B, 720C, 720D, and 720E, take two or more images from different viewpoints inside the volume between the first plane and the collector mirror 110. Thus, based on the captured images, a location, size, and velocity of the debris 26 in the volume between the first plane and the collector mirror 110 are determined, e.g., sampled. Also, based on the location, size, and/or velocity of the debris 26 in the captured images, the flow of the debris 26 can be determined and it is projected to determine which debris 26 hits the collector mirror. In some embodiments, the amount of debris 26 deposited on the collector mirror 110 is calculated and a map of the deposited debris 26 on the collector mirror 110 is generated. As noted, based on the map of the amount of debris on the collector mirror, it may be determined when is the time for the cleaning of the collector mirror or the replacement of the collector mirror. In some embodiments, when between about 70% to about 85% of the collector mirror 110 is covered by the debris, the collector mirror 110 is cleaned.

FIG. 7B illustrate an apparatus for velocimetry of droplets of debris of an EUV lithography system and monitoring collector mirror contamination, according to some embodiments of the present disclosure. The device 800 shows the DIM 710, which is consistent with DIM 710A of FIG. 7A and the DDM 720, which is consistent with the DDM 720A of FIG. 7A. A light source of the DIM 710 illuminates the tin droplets DP, the debris droplets 25, and the debris 26 in the EUV radiation source 100. The device 800 further captures images of the tin droplets DP, the debris droplets 25, and the debris 26 in the EUV radiation source 100.

In an embodiment, the light source of the DIM 710 is used for illuminating, by light beam 740, the zone of excitation ZE and around the zone of excitation ZE that includes a target droplet DP ejected by from the nozzle 117 of the droplet generator 115 and moving in a direction 810, e.g., a vertical direction. As discussed, in some embodiments, the light beam 740 is a light curtain beam that illuminates a plane that includes the zone of excitation ZE, which also includes one or more of the tin droplets DP, the debris droplets 25, and the debris 26. The reflected or scattered light 820 from the target droplet DP and the debris droplets 25, the reflected or scattered light 820 from the debris 26, and/or the reflected or scattered light 820 from debris in the plasma plume 23 is captured by an image sensor, e.g., a camera, in the DDM 720. In some embodiments and consistent with FIG. 7A, one or more other DIMS, having corresponding light sources, are included in the device 800 and the other DIMs are used to illuminate other parts and/or other views of the EUV radiation source 100. Also, in some embodiments and consistent with FIG. 7A, one or more other DDMs having corresponding image sensors, e.g., cameras, are included in the device 800 and the other camera are used for capturing the reflected or scattered light from the target droplet DP, the debris droplets 25, and the debris 26. The use of additional light beams 740 of the light sources of the other DIMs and using the cameras of the other DDMs allows capturing images from multiple locations and viewpoints inside the EUV radiation source 100. As noted above, the camera of DDM 720 and the cameras of the other DDMs, take two or more images, with the slight time difference between consecutive images. Thus, the device 800 is used for velocimetry by calculating e.g., determining, a velocity of the target droplet DP, the debris droplets 25, and the debris 26 of the entire inner space of the EUV radiation source 100. The velocity is determined by analyzing the captured consecutive images of each viewpoint as will be described with respect to FIG. 9B.

In some embodiments, when the laser beam LR2, the excitation laser beam, hits the target droplet DP within the zone of excitation ZE, the plasma plume 23 forms because of ionization of the target droplet DP that causes the target droplet DP to expand rapidly into a volume. The volume of the plasma plume 23 dependents on the size of the target droplet DP and the energy provided by the laser beam LR2. In various embodiments, the plasma expands several hundred microns from the zone of excitation ZE. As used herein, the term "expansion volume" refers to a volume to which plasma expands after the target droplets are heated with the excitation laser beam LR2.

In some embodiments, the DIM 710 includes a continuous wave laser. In other embodiments, the DIM 710 includes a pulsed laser. The wavelength of the laser of the DIM 710 is not particularly limited. In some embodiments, the laser of the DIM 710 has a wavelength in the visible region of electromagnetic spectrum. In some embodiments, the DIM 710 has a wavelength of about 1070 nm. In some embodiments, the laser of the DIM 710 has an average power in the range from about 1 W to about 50 W. For example, in some embodiments, the laser of the DIM 710 has an average power of about 1 W, about 5 W, about 10 W, about 25 W, about 40 W, about 50 W, or any average power between these values. In some embodiments, the DIM 710 generates a beam having a uniform illumination profile. For example, in some embodiments, the DIM 710 creates a fan-shaped light curtain or a thin plane of light having substantially the same intensity across its profile.

As the target droplet DP passes through the beam generated by the DIM 710, the target droplet DP reflects and/or scatters the photons in the beam. In an embodiment, the target droplet DP produces a substantially Gaussian intensity profile of scattered photons. The photons scattered by the target droplet DP are detected by the DDM 720. In some embodiments, the peak of the intensity profile detected by the DDM 720 corresponds to the center of the target droplet DP. In some embodiments, the DDM 720 includes a photodiode and generates an electrical signal upon detecting the photons reflected and/or scattered by the target droplet DP. In some embodiments, the DDM 720 includes a camera and generates two or more consecutive images upon of the photons reflected and/or scattered by the target droplet DP.

In an embodiment, a synchronizer 730 synchronizes the illumination light beam 740 generated by the DIM 710 with the recording of the illumination light reflected from or scattered by the particles to the DDM 720. In some embodiments, a controller 750 controls and synchronizes the DIM 710, the DDM 720, the synchronizer 730, the releasing of tin droplets DP by the droplet generator 115. In addition, the controller 750 provides a trigger signal to the laser source 300 of FIG. 1 that generates the laser beam LR2 such that a laser pulse generating the laser beam LR2 is synchronized with the releasing of tin droplets DP, the DIM 710, and the DDM 720. In some embodiments, the controller 750 controls the DIM 710 and DDM 720 through the synchronizer 730. In some embodiments, the synchronizer 730 does not exist and the controller 750 directly controls and synchronizes the DIM 710, the DDM 720, the laser source 300, and the droplet generator 115.

In some embodiments, particle image velocimetry is used to monitor the flow of one or more of debris 26, plasma plume 23, and gases such as hydrogen, in the EUV radiation source 100. Particle image velocimetry (PIV) is an optical method of flow visualization used to obtain instantaneous velocity measurements and related properties in fluids. Tracer particles that are sufficiently small enough to follow the flow dynamics are illuminated so that particles are visible. The particles are imaged and the motion of the tracer particles is used to calculate speed and direction (the velocity) of the flow of the fluid. In some embodiments, the tracer particles are particles of debris 26 for velocimetry of the gases, e.g., the hydrogen, in the EUV radiation source 100. In some embodiments, the velocimetry of metal particles (tin particles) is performed to determine a flow of tin particles and to calculate how much tin particles is deposited on the collector mirror.

PIV produces two-dimensional or even three-dimensional vector fields. During PIV, the particle concentration is such that it is possible to identify individual particles in an image, but not with certainty to track it between images. When the particle concentration is so low that it is possible to follow an individual particle, it is called Particle Tracking Velocimetry, while Laser Speckle Velocimetry is used for cases where the particle concentration is so high that it is difficult to observe individual particles in an image.

In some embodiments, the PIV apparatus includes a droplet detection module (DDM) 720, such as a digital camera with a CCD chip, a droplet illumination module (DIM) 710, such as a strobe or laser with an optical arrangement to limit the physical region illuminated. In some embodiments, the DIM 710 includes a cylindrical lens to convert a light beam to a line. In some embodiments, the PIV includes a synchronizer 730 to act as an external trigger for control of the camera and illumination light source. In some embodiments, a fiber optic cable or liquid light guide connect the illumination light source to the lens setup. The controller 950 is programmed with PIV software to post-process the optical images.

To perform PIV analysis on the flow, two exposures of the illumination light are required upon the DDM from the flow. Digital cameras using CCD or CMOS image sensors can capture two frames at high speed with a few hundred ns difference between the frames. This enables each exposure to be isolated on its own frame for accurate cross-correlation analysis.

In some embodiments of the PIV apparatus, lasers are used as the DIM 710 due to their ability to produce high-power light beams with short pulse durations. This yields short exposure times for each frame. In some embodiments, Nd:YAG lasers are used in PIV setups. The Nd:YAG lasers emit primarily at the 1064 nm wavelength and its harmonics (532, 266, etc.). For safety reasons, the laser emission is typically bandpass filtered to isolate the 532 nm harmonics (this is green light, the only harmonic able to be seen by the naked eye).

The optics include a spherical lens and cylindrical lens combination in some embodiments. The cylindrical lens expands the laser into a plane while the spherical lens compresses the plane into a thin sheet. It should be noted though that the spherical lens cannot compress the laser sheet into an actual 2-dimensional plane. The minimum thickness is on the order of the wavelength of the laser light and occurs at a finite distance from the optics setup (the focal point of the spherical lens). The lens for the camera should also be selected to properly focus on and visualize the particles within the investigation area.

The synchronizer 730 acts as an external trigger for both the DDM 720 and the DIM 710. The controller 750 controls the synchronizer 730, DIM 710, and DDM 720. The synchronizer 730 can dictate the timing of each frame of the DIM sequence in conjunction with the firing of the illumination light source to within 1 ns precision. Thus, the time between each pulse of the laser and the placement of the laser shot in reference to the camera's timing can be accurately controlled. Knowledge of this timing is critical as it is needed to determine the velocity of the fluid in the PIV analysis. Stand-alone electronic synchronizers, called digital delay generators, offer variable resolution timing from as low as 250 ps to as high as several milliseconds. With up to eight channels of synchronized timing, they offer the means to control several flash lamps and Q-switches as well as provide for multiple camera exposures.

The frames are split into a large number of interrogation areas, or windows, in some embodiments. It is then possible to calculate a displacement vector for each window with help of signal processing and autocorrelation or cross-correlation techniques. This is converted to a velocity using the time between laser shots and the physical size of each pixel on the camera. The size of the interrogation window in some embodiments is selected to have at least 6 particles per window on average. The synchronizer 730 controls the timing between image exposures and also permits image pairs to be acquired at various times along the flow. The scattered light from each particle is in the region of 2 to 4 pixels across on the image in some embodiments. If too large an area is recorded, particle image size drops and peak locking might occur with loss of sub pixel precision.

Figure 8A:
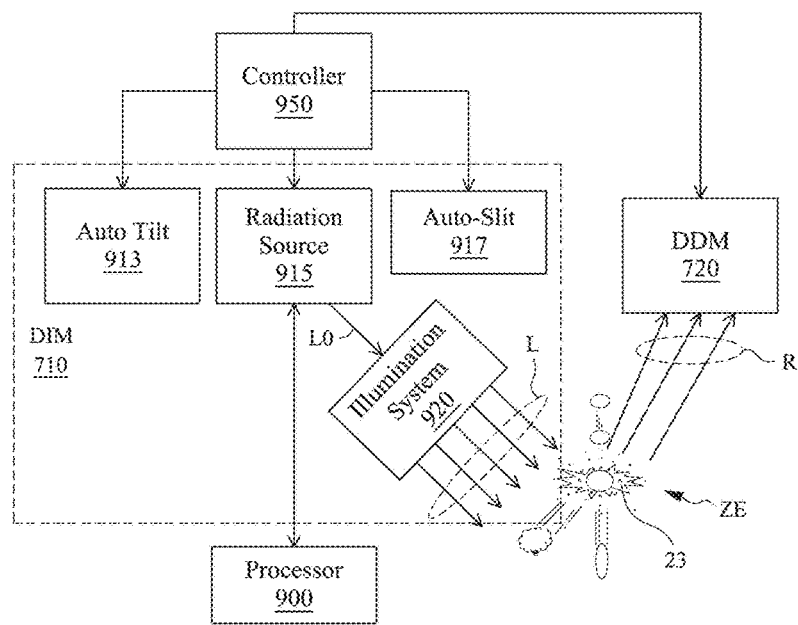
FIG. 8A schematically illustrates an apparatus for measuring a speed of the target droplet DP, the debris droplets, or the debris in a EUV radiation source, in accordance with some embodiments of the present disclosure.

FIG. 8A schematically illustrates an apparatus for measuring a velocity of the target droplet DP, the debris droplets 25, or the debris 26 in the EUV radiation source 100, in accordance with some embodiments of the present disclosure. In an embodiment, the apparatus includes the DIM 710, the DDM 720, a controller 950 and a processor 900.

In some embodiments, the DIM 710 includes a radiation source 915, a tilt control mechanism 913 and a slit control mechanism 917. The tilt control mechanism 913 (also referred to herein as "auto tilt") controls the tilt of the radiation source 915, which is consistent with the EUV radiation source 100 of FIG. 1. In some embodiments, the auto tilt 913 is a stepper motor coupled to the radiation source 915 (e.g., a laser source) of the DIM 710 and moves the radiation source 915 to change the angle of incidence at which light (or radiation) L is incident on the target droplet DP or plasma plume 23 (and in effect changing the amount of light R reflected and/or scattered by the target droplet DP or plasma plume 23 into the DDM 720). In some embodiments, the auto tilt 913 includes a piezoelectric actuator. In some embodiments, the light R is also reflected from the debris droplet 25 and the debris 26. In some embodiments, the illumination system 920 receives light beam LO, e.g., a laser beam, from radiation source 915 and transforms the light beam LO into light beam L, which is a thin plane of light (a light curtain).

Figure 8B:
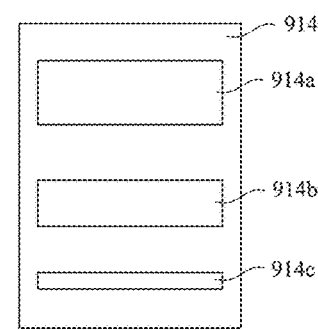
FIG. 8B is a detailed view of an opaque barrier having slits used in the apparatus of FIG. 8A in accordance with an embodiment of the present disclosure.

The slit control mechanism 917 (also referred to herein as "auto slit") controls the amount of light that illuminates the zone of excitation ZE. In some embodiments, an illumination system 920 is disposed between the radiation source 915 and the zone of excitation ZE. The slit control mechanism 917 of the illumination system 920 controls the amount of light which irradiates the target droplet DP, the plasma plume 23, the debris droplets 25, and the debris 26. In some embodiments, the illumination system 920 includes a movable opaque barrier 914, as depicted in FIG. 8B, having several slits (narrow openings) 914a, 914b, 914c of different sizes and the slit control mechanism 917 determines which slit the light beam passes through. When, for example, the controller 950 determines that the intensity of light detected at the DDM 720 is lower than the acceptable range, the controller 950 commends the slit control mechanism 917 to move the slits such that a wider slit 914a is provided in the path of light in the illumination system 920, allowing more light to irradiate the zone of excitation ZE, increasing the detected intensity. On the other hand, if it is determined that the intensity of light detected at the DDM 720 is higher than the acceptable range, the controller 950 commands the slit control mechanism 917 to move the slits such that a narrower slit 914c is provided in the path of light in the illumination system 920, thereby reducing the detected intensity. In some embodiments, the parameters of the DIM 710 adjusted by the controller 950 includes the width of the slit in the opaque barrier 914 in the path of light beam L exiting the illumination system 920.

While the auto tilt 913 and auto slit 917 are depicted in the FIG. 8A as being separate from the radiation source 915, in some embodiments, the auto tilt 913 and the auto slit 917 can be integrated with the radiation source 915 to form a single DIM 710. In such embodiments, the coupling between the controller 950 and the DIM 710 can be suitably modified to provide the same result as disclosed herein. The controller 950, thus, sets the intensity of light detected at the DDM 720 to enable a stable detection of target droplets over a duration of time.

Figure 9B:
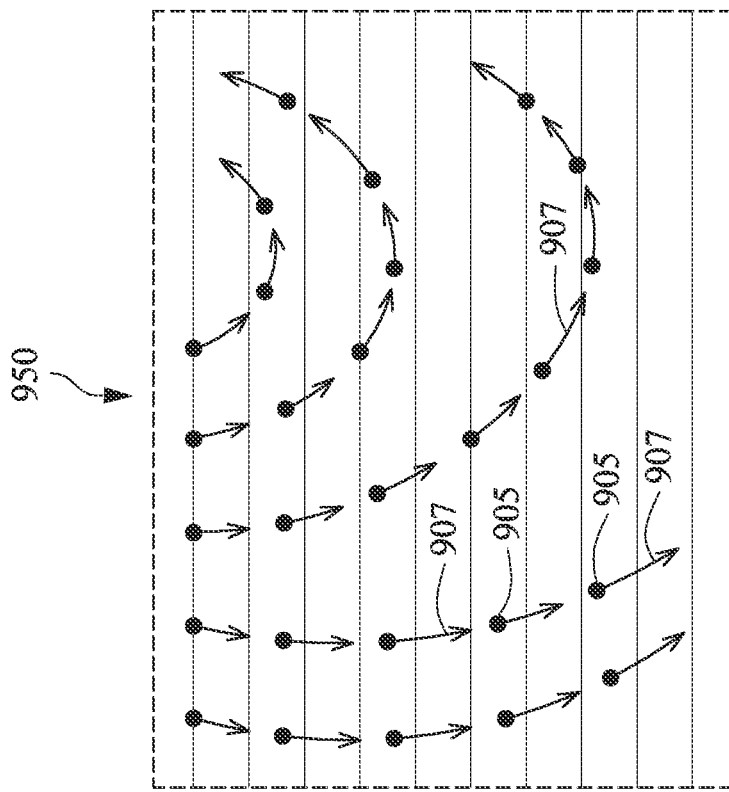
FIG. 9B is an exemplary graph of the particle flow in an extreme ultraviolet radiation source according to embodiments of the present disclosure.
Figure 9A:
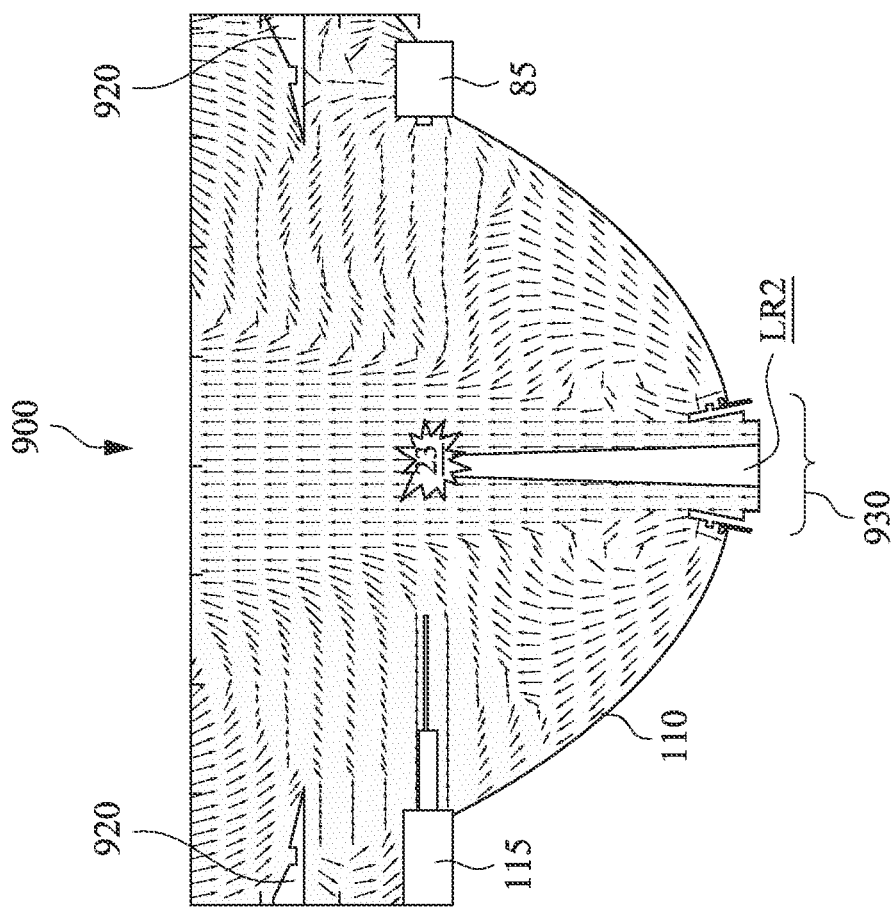
FIG. 9A is an exemplary graph of the gas flow in an extreme ultraviolet radiation source according to embodiments of the present disclosure.

FIG. 9A is an exemplary graph 910 of the gas flow in an extreme ultraviolet radiation source according to embodiments of the present disclosure. The graph 910 shows a cross-sectional view of the EUV radiation source 100 that includes the collector mirror 110, the droplet generator 115, the droplet catcher 85, and heat shields 925. In some embodiments and consistent with FIG. 1, the laser beam LR2 enters from the opening 930 of the collector mirror 110. The arrows of the graph 910 show the gas flow, e.g., the hydrogen flow, inside the EUV radiation source 100. As discussed with respect to FIG. 3, the laser beam LR2 may interact with a droplet DP released from the droplet generator 115 to form the laser plume 23 that emits the EUV light rays 24 in all directions. During the laser-metal interaction, a droplet DP could be missed, thereby forming debris droplet 25. Also, some tin leftover from the plasma formation process can become debris 26. In some embodiments, the particles, e.g., the debris droplet 25 and debris 26, are influenced, e.g., carried, by the gas flow. Because the particles have much higher mass than the gas, the gas flow although influences the flow of the particles but the particle do not follow the gas flow. As described above the particle flow may be determined using the PIV analysis. As shown in the graph 910, the gas flow near the inner surface of the collector mirror 110 is tangential to reduce the deposition of the debris 26 on the collector mirror 110.

FIG. 9B is an exemplary graph 955 of the particle flow in an extreme ultraviolet radiation source according to embodiments of the present disclosure. In some embodiments, the graph 955 shows the particle flow in a portion of the inside of the EUV radiation source 100. In FIG. 9B, the dots 905, are metal particles, e.g., tin particles such as debris 26. The direction and size of the arrows 907 show the velocity of the dots 905 (e.g., metal particles) that are determined using the PIV analysis. Thus, the combination of the arrows 907 show a flow of the metal particles. In some embodiments and returning back to FIG. 8A, the processor 900 receives the consecutive images that are captured by a camera of DDM 720 and by applying image processing methods such as blob analysis determines the metal particle inside each image. The processor 900 further applies image processing methods, e.g., segmentation methods, to divide the images into multiple regions and further applies image processing methods such as correlation to compare the regions of consecutive images to determine the same metal particles in consecutive images. The processor further determines the velocity of a metal particle based on the location of the same particles in the consecutive images and a time difference between the consecutive images.

Figure 10:
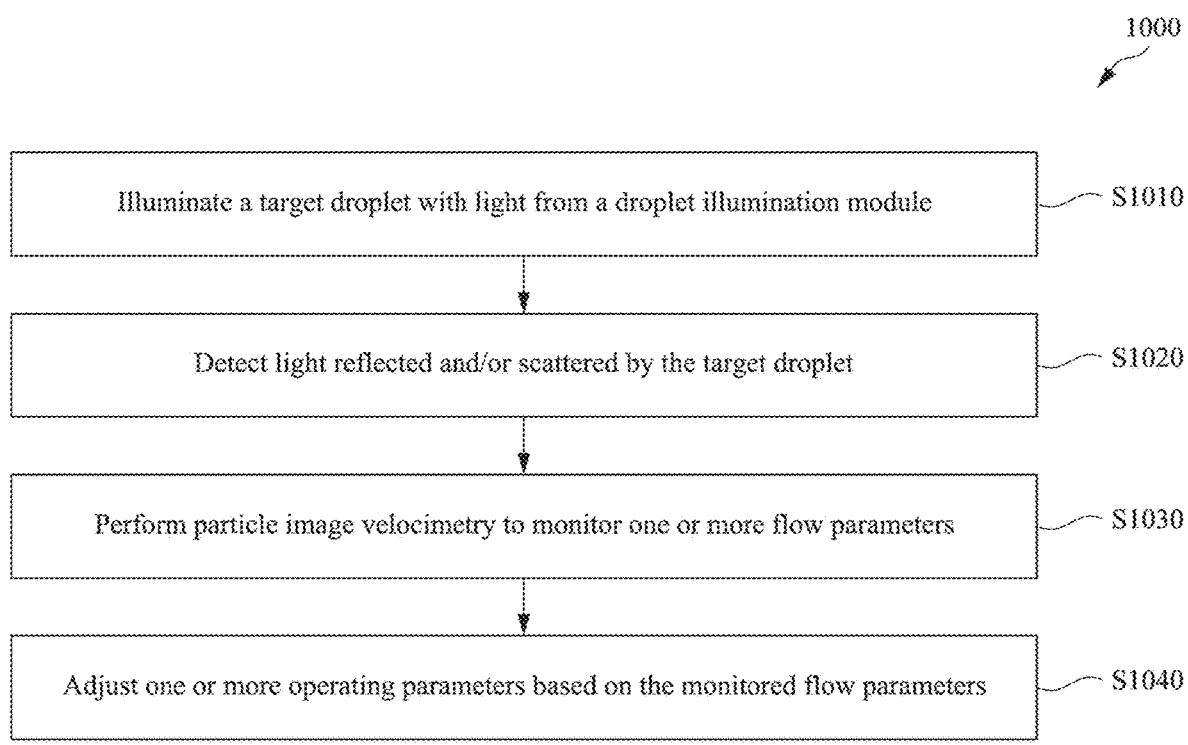
FIG. 10 illustrates a flow diagram of an exemplary process for velocimetry of droplets of an EUV lithography system according to some embodiments of the disclosure.

FIG. 10 illustrates a flow diagram of an exemplary process 1000 for velocimetry of droplets of an EUV lithography system according to some embodiments of the disclosure. In operation S1010, a target droplet, e.g., debris droplet 25 of FIG. 3, is irradiated in an extreme ultraviolet radiation source 100 (light source) of an extreme ultraviolet lithography tool with light from a droplet illumination module, e.g., DIM 710 of FIG. 7B. The light reflected and/or scattered by the target droplet is detected, e.g., by DDM 720, in operation S1020. Next, particle image velocimetry is performed, e.g., by controller 950 of FIG. 8A, in operation S1030 to monitor one or more flow parameters inside the extreme ultraviolet radiation source. In some embodiments, one or more operating parameters of the extreme ultraviolet radiation source are adjusted based on the monitored flow parameters in operation S1040.

FIGS. 11A and 11B illustrate an apparatus for velocimetry of droplets of debris of an EUV lithography system and monitoring collector mirror contamination, according to some embodiments of the present disclosure. FIG. 11A is a schematic view of a computer system that performs the velocimetry of droplets of debris in an EUV lithography system. All of or a part of the processes, method and/or operations of the foregoing embodiments can be realized using computer hardware and computer programs executed thereon. The operations includes determining an amount of debris deposited on the collector mirror. In FIG. 11A, a computer system 1100 is provided with a computer 1101 including an optical disk read only memory (e.g., CD-ROM or DVD-ROM) drive 1105 and a magnetic disk drive 1106, a keyboard 1102, a mouse 1103, and a monitor 1104.

FIG. 11B is a diagram showing an internal configuration of the computer system 1100. In FIG. 11B, the computer 1101 is provided with, in addition to the optical disk drive 1105 and the magnetic disk drive 1106, one or more processors, such as a micro processing unit (VIPU), a ROM 1112 in which a program such as a boot up program is stored, a random access memory (RAM) 1113 that is connected to the MPU 1111 and in which a command of an application program is temporarily stored and a temporary storage area is provided, a hard disk 1114 in which an application program, a system program, and data are stored, and a bus 1115 that connects the MPU 1111, the ROM 1112, and the like. Note that the computer 1101 may include a network card (not shown) for providing a connection to a LAN.

The program for causing the computer system 1100 to execute the functions of an apparatus for performing the velocimetry of droplets of debris and monitoring collector mirror contamination in the foregoing embodiments may be stored in an optical disk 1121 or a magnetic disk 1122, which are inserted into the optical disk drive 1105 or the magnetic disk drive 1106, and transmitted to the hard disk 1114. Alternatively, the program may be transmitted via a network (not shown) to the computer 1101 and stored in the hard disk 1114. At the time of execution, the program is loaded into the RAM 1113. The program may be loaded from the optical disk 1121 or the magnetic disk 1122, or directly from a network. The program does not necessarily have to include, for example, an operating system (OS) or a third party program to cause the computer 1101 to execute the functions of the photo mask data generating and merging apparatus in the foregoing embodiments. The program may only include a command portion to call an appropriate function (module) in a controlled mode and obtain desired results.

In some embodiments and returning back to FIG. 7B or 8A, the DDM 720 includes a photodiode designed to detect light having a wavelength of the light from the DIM 710. In some embodiments, the DDM 720 further includes one or more filters for filtering certain frequencies of light. For example, in an embodiment, the DDM 720 includes a filter for blocking deep ultraviolet (DUV) radiation. In another embodiment, the DDM 720 includes a filter for blocking all frequencies other than that of the light from the DIM 710.

Referring back to FIG. 7B, in some embodiments, the controller 750 is a logic circuit programmed to receive a signal from the DDM 720, and depending on the received signal transmit control signals to one or more components of the DIM 710 to automatically adjust one or more operating parameters of the EUV radiation source.

In some embodiments, as shown in FIG. 7A, two or more light sources, e.g., lasers, and/or two or more image sensors, e.g., cameras are provided in the EUV radiation source to monitor the flows in the entire inner space of the EUV radiation source.

In the present disclosure, by performing particle image velocimetry, the timing of tin droplet generation and irradiation is improved in some embodiments. In some embodiments, a plasma flow is optimized as a result of the particle image velocimetry. In some embodiments, based on particle image velocimetry the operating parameters of the EUV radiation source are adjusted to optimize the debris field and to limit the deposition of debris on the surface of the collector mirror. For example, the flow of the gasses (e.g., hydrogen flow) in the EUV radiation source 100 is increased to reduce the contamination of the collector mirror 110. In some embodiments, a position where the laser beam LR2 hits the droplet DP is adjusted and/or a time of the laser pulse generating the laser beam LR2 is adjusted to reduce the contamination of the collector mirror 110.

According to some embodiments of the present disclosure, a method for monitoring flow parameters includes irradiating a target droplet in an extreme ultraviolet (EUV) light source of an extreme ultraviolet lithography tool with non-ionizing light from a droplet illumination module. The method also includes detecting light reflected and/or scattered by the target droplet. The method further includes performing particle image velocimetry, based on the detected light, to monitor one or more flow parameters inside the EUV light source. In an embodiment, the method further includes adjusting one or more operating parameters of the EUV light source based on the monitored flow parameters. In an embodiment, the monitored flow parameters include one or more of a flow pattern of gases, droplets, or debris in the EUV light source, the droplets and debris propagation direction, and spatial evolution of a plasma shockwave. In an embodiment, the method also includes monitoring a rate of an amount of droplet and debris depositing on a collector mirror of the EUV light source and adjusting the one or more operating parameters of the EUV light source to reduce the rate. In an embodiment, the method further includes mapping the amount of droplet and debris deposited on the collector mirror and triggering a cleaning mechanism to clean the collector mirror based on the mapping. In an embodiment, the non-ionizing light irradiating the target droplet has a wavelength of about 1064 nm. In an embodiment, the source of the non-ionizing light of the droplet illumination module is a laser. In an embodiment, the light reflected and/or scattered by the target droplet is detected by a droplet detection module. In an embodiment, the droplet detection module comprises a digital camera.

According to some embodiments of the present disclosure, a method for monitoring a rate of deposition of metal debris includes irradiating one or more of tin droplets and tin debris in an extreme ultraviolet light source of an extreme ultraviolet lithography tool with non-ionizing light from a droplet illumination module. The method includes detecting light reflected and/or scattered by the one or more of the tin droplets and the tin debris. The method also includes performing particle image velocimetry, based on the detected light, to monitor a rate of an amount of the tin droplets and the tin debris depositing on a collector mirror of the extreme ultraviolet light source. In an embodiment, the method further includes adjusting one or more operating parameters of the extreme ultraviolet light source to reduce the rate. In an embodiment, the method further includes mapping the amount of tin droplets and tin debris deposited on the collector mirror and triggering a replacement mechanism to change the collector mirror based on the mapping. In an embodiment, the method further includes mapping the amount of tin droplets and tin debris deposited on the collector mirror and determining a half life time of the collector mirror based on the mapping.

According to some embodiments of the present disclosure, a method for reducing a rate of deposition of metal debris on a collector mirror includes irradiating one or more metal debris in an extreme ultraviolet light source of an extreme ultraviolet lithography tool with non-ionizing light. The method includes detecting light reflected and/or scattered by the one or more metal debris. The method also includes performing particle image velocimetry, based on the detected light, to monitor a rate of an amount of the metal debris depositing on the collector mirror of the extreme ultraviolet light source. The method further includes adjusting one or more flow parameters of gases in the extreme ultraviolet light source to reduce the rate of deposition of the metal debris.

According to some embodiments of the present disclosure, an apparatus for monitoring flow parameters of particles in an extreme ultraviolet light source of an extreme ultraviolet lithography system includes a droplet illumination module that includes a radiation source for illuminating a target droplet. The apparatus also includes a droplet detection module for detecting light reflected and/or scattered by the target droplet and a controller coupled to the droplet illumination module and the droplet detection module. The droplet detection module performs particle image velocimetry to monitor one or more flow parameters inside the extreme ultraviolet light source. In an embodiment, the controller is further programmed to adjust one or more operating parameters of the extreme ultraviolet light source based on the monitored flow parameters. In an embodiment, the radiation source comprises a laser. In an embodiment, the laser produces a non-ionizing light having a wavelength of about 1064 nm. In an embodiment, the apparatus further includes a synchronizer that synchronizes the droplet illumination module and the droplet detection module. In an embodiment, the controller also controls the synchronizer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for monitoring flow parameters of particles in an extreme ultraviolet light source of an extreme ultraviolet lithography system, comprising:
   a droplet detection module configured to detect light reflected and/or scattered from a metal droplet; and
   a controller coupled to the droplet detection module and configured to:
   perform particle image velocimetry to monitor one or more flow parameters inside the extreme ultraviolet light source.

2. The apparatus of claim 1, wherein the controller is further programmed to adjust one or more operating parameters of the extreme ultraviolet light source based on the monitored flow parameters.

3. The apparatus of claim 1, further comprising a laser configured to generate the light.

4. The apparatus of claim 3, wherein the light is a non-ionizing light having a wavelength of about 1064 nm.

5. The apparatus of claim 3, further comprising a synchronizer that synchronizes the laser and the droplet detection module.

6. The apparatus of claim 5, wherein the controller is further configured to control the synchronizer.

* * * * *